US008487344B2

(12) United States Patent
Seong

(10) Patent No.: US 8,487,344 B2
(45) Date of Patent: Jul. 16, 2013

(54) OPTICAL DEVICE AND METHOD OF FABRICATING THE SAME

(75) Inventor: Tae-Yeon Seong, Seoul (KR)

(73) Assignee: Samsung Display Co., Ltd. (KR)

( * ) Notice: Subject to any disclaimer, the term of this patent is extended or adjusted under 35 U.S.C. 154(b) by 764 days.

(21) Appl. No.: 12/097,359

(22) PCT Filed: Dec. 15, 2006

(86) PCT No.: PCT/KR2006/005505
§ 371 (c)(1),
(2), (4) Date: Jun. 13, 2008

(87) PCT Pub. No.: WO2007/069871
PCT Pub. Date: Jun. 21, 2007

(65) Prior Publication Data
US 2008/0258174 A1    Oct. 23, 2008

(30) Foreign Application Priority Data

Dec. 16, 2005  (KR) .................. 10-2005-0124258
Dec. 16, 2005  (KR) .................. 10-2005-0124260

(51) Int. Cl.
*H01L 27/00*  (2006.01)
(52) U.S. Cl.
USPC ............ 257/184; 438/609; 257/E29.11
(58) Field of Classification Search
USPC ............... 257/184, E29.111; 438/609
See application file for complete search history.

(56) References Cited

U.S. PATENT DOCUMENTS

| 7,265,374 B2 * | 9/2007 | Lee et al. ............ 257/13 |
| 2002/0171087 A1 * | 11/2002 | Krames et al. ........ 257/81 |
| 2005/0133803 A1 | 6/2005 | Seong et al. |
| 2006/0125385 A1 | 6/2006 | Lu et al. |

FOREIGN PATENT DOCUMENTS

| EP | 1 548 852 A2 | 6/2005 |
| EP | 1 548 852 A3 | 12/2006 |
| JP | 2001-196633 | 7/2001 |
| JP | 2004-336021 | 11/2004 |
| JP | 2005-079176 | 3/2005 |
| JP | 2005-117006 | 4/2005 |
| JP | 2005-184001 | 7/2005 |
| JP | 2005-191572 | 7/2005 |
| JP | 2005-229085 | 8/2005 |
| KR | 1020050034155 | 4/2005 |
| KR | 1020050046455 | 5/2005 |
| KR | 1020050063293 | 6/2005 |

(Continued)

OTHER PUBLICATIONS

International Search Report, PCT/KR2006/005505, mailing date Dec. 16, 2005.

(Continued)

*Primary Examiner* — Howard Weiss
*Assistant Examiner* — Steven Rao
(74) *Attorney, Agent, or Firm* — Innovation Counsel LLP

(57) ABSTRACT

Disclosed is an optical device including an optical member and a contact layer stacked on at least one of top and bottom surfaces of the optical member. The contact layer has at least one transparent conducting oxynitride (TCON) layer. The TCON consists of at least one of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd).

20 Claims, 4 Drawing Sheets

FOREIGN PATENT DOCUMENTS

| KR | 1020050064500 | 6/2005 |
|---|---|---|
| KR | 1020050081207 | 8/2005 |
| KR | 1020050086390 | 8/2005 |
| KR | 1020050089769 | 9/2005 |
| KR | 1020050091579 | 9/2005 |
| KR | 1020050097472 | 10/2005 |
| KR | 1020060007945 | 1/2006 |

OTHER PUBLICATIONS

Written Opinion of the International Searching Authority, PCT/KR2006/005505, mailing date Mar. 21, 2007.
Aperathitis Elias et al.: "Properties of rf-sputtered indium-tin-oxynitride thin films", Journal of Applied Physics, American Institute of Physics. New York, US, vol. 94, No. 2, Jul. 15, 2003, pp. 1258-1266, XP012059766.
Aperathitis Elias et al.: "Optical characterization of indium-tin-oxynitride fabricated by RF-sputtering", Thin Solid Films, Elsevier-Sequoia S.A. Lausanne, CH, vol. 450 No. 1, Feb. 22, 2004, pp. 101-104, XP004490689.
Futsuhara M et al.: "Optical properties of zinc oxynitride thin films", Thin Solid Films, Elsevier-Sequoia S. A., Lausanne, CH, vol. 317, No. 1-2, Apr. 1, 1998, pp. 322-325, XP004147672.
Database Compendex [Online] Engineering Information, Inc., New York, NY, US; Dec. 28, 2001, Martin N. Et All "Correlation between processing and properties of TiOxNy thin films sputter deposited by the reactive gas pulsing technique", XP002613477, Database accession No. E2001556805657 abstract.
Martin N. et al.: "Correlation between processing and properties of TiOxNy thin films sputter deposited by the reactive gas pulsing technique", Applied Surface Science 20011228 Elsevier NL, vol. 185, No. 1-2, Dec. 28, 2001, pates 123-133, XP002613478.
Extended European Search Report EP 06 83 5223, Jan. 14, 2011, 7 pages.
Chang C S et al: "Nitride-Based LEDs With an SPS Tunneling Contact Layer and an ITO Transparent Contact". IEEE Photonics Technology Letters, IEEE Service Center, Piscataway, NJ, US, vol. 16, No. 4, Apr. 1, 2004, pp. 1002-1004, XP011110186, ISSN: 1041-1135.

* cited by examiner

US 8,487,344 B2

OPTICAL DEVICE AND METHOD OF FABRICATING THE SAME

CROSS-REFERENCE TO RELATED APPLICATIONS

This application claims prority under 35 U.S.C. §317 PCT/KR2006/005505 filed Dec. 15, 2006 which claims priority of Korean Patent Application Nos. 10-2005-0124258 and 10-2005-0124260 both of which were filed in the Koran Intellectual Property Office on Dec. 16, 2005, the contents of which are herein incorporated by reference in their entireties.

TECHNICAL FIELD

The present invention relates to an optical device. More particularly, the present invention relates to an optical device having high efficiency and a method of fabricating the same.

BACKGROUND ART

Recently, transparent conducting thin films are used in various fields, such as optoelectronic fields, display fields and energy industrial fields using organic and inorganic materials. In the field of semiconductor light emitting devices including light emitting diodes and laser diodes, materials having superior electrical and optical characteristics must be used in order to promote carrier injection and current spreading and to facilitate emission of photons generated from an active layer of a semiconductor light emitting device.

Many domestic and foreign institutes related to group III nitride light emitting diodes (III nitride LEDs), which are spotlighted as next-generation light sources for illumination, have actively studied to develop transparent conducting thin films. As a result, recently, transparent conducting materials, such as well-known indium tin oxide (ITO) and doped zinc oxide (ZnO) containing various impurities, are directly used as electrodes for nitride-based LEDs.

Among transparent conducting oxides (TCO), indium oxide ($In_2O_3$) tin oxide ($SnO_2$), cadmium oxide (CdO), zinc oxide (ZnO), and indium tin oxide (ITO) have been actively studied and developed. The above oxides have relatively low work function values and represent characteristics of suddenly lowering light transmittance at wavelength bands of a visible ray and an ultraviolet ray, so problems occur when the above oxides are used for transparent electrodes of the nitride LED. Problems of the above oxides, which are partially used for the nitride LED, are as follows.

First, since conventional TCO or transparent conducting nitride (TCN) has a work function value which is significantly lower than that of a p-type nitride-based cladding layer, if the TCO or TCN is used as a p-type ohmic contact layer, a high energy barrier is formed at an interfacial surface against the carrier flow, so hole injection is very difficult. For this reason, realizing an LED having high external quantum efficiency (EQE) is very difficult.

In addition, since conventional TCO or TCN does not flexibly match with the electric characteristics formed at the surface of an n-type nitride-based cladding layer, if the TCO or TCN is used as an n-type nitride-based Schottky or an ohmic contact electrode structure, the controlling and injecting of holes relative to the carrier flow may be difficult. For this reason, realizing a light receiving diode or an LED having high light receiving efficiency or high external quantum efficiency (EQE) is very difficult.

Second, conventional TCO or TCN represents low light transmittance against specific lights created in and output from the nitride-based LED. In detail, the TCO or TCN represents low light transmittance against light having a wavelength band equal to or lower than that of a blue light, so the TCO or TCN is not suitable for to an LED that emits a light having a short wavelength.

Third, since conventional TCO or TCN has a great light reflective index approximating to 2, emitting the light to an atmosphere through the TCO or TCN is very difficult.

Recently, electronic devices, such as transistors and photodetectors, and optical devices, such as LEDs and laser diodes (LDs), have been widely commercialized by using nitride-based semiconductors. In order to realize optoelectronic devices having superior performance, the contact controlling technology capable of improving the interfacial characteristics between the III nitride-based semiconductor and the electrode is very important.

LEDs using a nitride-based semiconductor including indium nitride (InN), gallium nitride (GaN) and aluminum nitride (AlN) are classified into top-emission LEDs (TELEDs) and flip-chip LEDs (FCLEDs).

According to the currently available TELED, light generated from the TELED is output through a p-type ohmic contact layer that makes contact with a p-type nitride-based cladding layer. In contrast, in the case of the FCLED, which is fabricated as a large-size and large-capacity LED because heat dissipation thereof is easily achieved during the operation as compared with that of the TELED, the light created from an active layer is emitted through a transparent sapphire substrate by using a high reflective p-type ohmic contact layer.

Since the p-type nitride-based cladding layer has a low hole-density, the LED employing the III nitride-based semiconductor may not easily transport holes, which are p-type carriers, in various directions at the p-type nitride-based cladding layer. Thus, in order to obtain the optoelectronic devices having superior performance using the p-type nitride-based cladding layer, a high-quality p-type ohmic contact layer having superior current spreading characteristics is essentially necessary.

In other words, in order to realize the high-quality next-generation LED by using the III nitride-based semiconductor, a p-type ohmic contact electrode structure capable of improving current spreading in the lateral direction and hole injecting in the vertical direction and having superior optical characteristics (light transmittance or light reflectance) for the visible ray and light having a short wavelength band must be developed.

The p-type ohmic contact layer of the TELED, which is extensively used in these days, includes oxidized nickel-gold (Ni—Au) formed on an upper portion of the p-type nitride-based cladding layer. A thin nickel-gold (Ni—Au) layer is deposited on the upper portion of the p-type nitride-based cladding layer by using an E-beam evaporator, and then the thin nickel-gold (Ni—Au) layer is annealed in the oxygen ($O_2$) atmosphere, thereby forming a semi-transparent ohmic contact layer having a low specific ohmic contact resistance value of about $10^{-3}$ $\Omega cm^2$ to $10^{-4}$ $\Omega cm^2$. The oxidized Ni—Au ohmic contact layer has low light transmittance of 75% or less in a wavelength band of blue light, which is below 460 nm, so the Ni—Au ohmic contact layer is not suitable for the p-type ohmic contact layer of the next-generation nitride-based LED. Due to the low light transmittance of the oxidized semi-transparent Ni—Au ohmic contact layer, nickel oxide (NiO), which is p-type semiconductor oxide, is created in the form of an island at a contact interfacial surface between gallium nitride (GaN) forming the p-type nitride-based cladding layer and nickel (Ni) forming the ohmic contact layer when the oxidized semi-transparent Ni—Au ohmic contact layer is annealed at the temperature of about 500° C. to about 600° C. in the oxygen ($O_2$) atmosphere. In addition, gold (Au) is interposed between nickel oxide (NiO) distributed in the form of an island while covering the upper portion of nickel oxide (NiO). In particular, when the thin Ni—Au layer deposited on the p-type nitride-based cladding layer is annealed in the oxygen ($O_2$) atmosphere, the nickel oxide (NiO) is formed. Such nickel oxide (NiO) may reduce Schottky barrier height and width (SBH and SBW) formed between gallium nitride (GaN) and an electrode, so that carriers are easily fed into a device through the electrode when an external voltage is applied. The thin oxidized Ni—Au layer exhibits superior ohmic behavior that is a superior electric characteristic because nickel oxide (NiO) can reduce the SBH and SBW and Au component can improve the current spreading in the lateral direction.

In addition to the superior ohmic behavior mechanism of the thin Ni—Au layer, if the p-type nitride-based cladding layer is annealed after the thin Ni—Au layer has been deposited on the p-type nitride-based cladding layer, Mg—H intermetallic compounds that restrict the net effective hole concentration in the p-type nitride-based cladding layer can be removed. Thus, the net effective hole concentration can be increased to a level of above $10^{18}/cm^3$ at the surface of the p-type nitride-based cladding layer through the reactivation process that increase concentration of magnesium dopants, so that a tunneling transport occurs between the p-type nitride-based cladding layer and the ohmic contact layer containing nickel oxide. Accordingly, the p-type nitride-based cladding layer exhibits the superior ohmic behavior with a low specific contact resistance value.

However, since the TELED employing the semi-transparent p-type ohmic contact electrode structure including the oxidized Ni—Au layer contains Au components that reduce the light transmittance by absorbing a great amount of light generated from the LED active layer, the TELED represents low EQE, so the TELED is not suitable for providing the large-size and large-capacity LED for illumination.

Recently, a document [T. Margalith et al., Appl. Phys. Lett. Vol 74. p 3930 (1999)] discloses the use of transparent conducting oxide, such as ITO, having superior light transmittance than that of the nickel-gold structure employed as a conventional p-type multi-layered ohmic contact layer, in order to solve the problems of the TELED and FCLED. A document (Solid-State Electronics vol. 47. p 849) shows that a TELED employing the ITO ohmic contact layer represents improved output power than that of a TELED employing the conventional nickel-gold structure.

However, although the ohmic contact layer employing the above ITO ohmic contact layer can increase the output power of the LED, the ohmic contact layer represents relatively higher operational voltage. This is because the ohmic contact layer has a relatively low work function value as compared with that of the p-type nitride-based semiconductor. For this reason, a high Schottky barrier is formed at the interfacial surface between the p-type nitride-based cladding layer and the ITO ohmic contact layer, so that carrier injection may not be readily achieved, thereby generating a great amount of heat and shortening the life span of the semiconductor device.

As mentioned above, if TCO such as ITO or ZnO is directly deposited on the p-type nitride-based cladding layer, the higher SBH and the wider SBW are formed so that the quality of the ohmic contact layer may be degraded. In order to solve this problem, a study group belong to GIST (Gwangju Institute of Science & Technology, Korea) recently discloses test results for high-quality ohmic contact layers including particles having a size of 100 nm or less, which are obtained by inserting a second TCO layer between a p-type nitride-based cladding layer and a first TCO layer and then annealing the resultant structure. The nano-particles created from the interfacial surface cause an electric field at the interfacial surface, so that the SBH and the SBW are reduced and the Schottky behavior of the TCO electrode is converted into the ohmic behavior by means of the electric field.

However, the high-transparent and high-quality p-type ohmic contact layer fabricated by using the above technologies and the vertical LED employing the same have limited light emitting areas and cause great heat dissipation during the operation, so the above p-type ohmic contact layer is not suitable for the next-generation light source for illumination.

DISCLOSURE OF INVENTION

Technical Problem

An object of the present invention is to provide an optical device having the high efficiency.

Another object of the present invention is to provide a method of fabricating such an optical device.

Technical Solution

In one aspect of the present invention, an optical device includes an optical member and a contact layer. The contact layer includes at least one transparent conducting oxynitride (TCON) layer stacked on at least one of top and bottom surfaces of the optical member. The TCON comprises at least one selected from a group consisting of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), which is combined with both oxygen (O) and nitrogen (N).

The optical member comprises an n-type nitride cladding layer, a p-type nitride cladding layer, and an active layer interposed between the n-type nitride cladding layer and the p-type nitride cladding layer. The contact layer includes at least one of an n-type contact layer formed on the n-type nitride cladding layer and a p-type contact layer formed on the p-type nitride cladding layer.

In another aspect of the present invention, a method of fabricating an optical device comprises forming an optical member and forming a contact layer by stacking at least one transparent conducting oxynitride (TCON) layer on at least one of top and bottom surfaces of the optical member. The TCON comprises at least one selected from a group consisting of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), which is combined with both oxygen (O) and nitrogen (N).

The method further includes a heat process which is performed after the contact layer has been formed. The heat process is conducted for about 10 seconds to about 3 hours at a temperature from about 100° C. to about 800° C. under a gas atmosphere including at least one selected a group consisting of nitrogen ($N_2$), oxygen ($O_2$), hydrogen ($H_2$), argon (Ar), helium (He) and air.

Advantageous Effects

According to the present invention, an ohmic contact characteristic can be improved by employing transparent conducting oxynitride (TCON), so that an optical device having the high efficiency can be obtained.

BEST MODE FOR CARRYING OUT THE INVENTION

Figure 1:
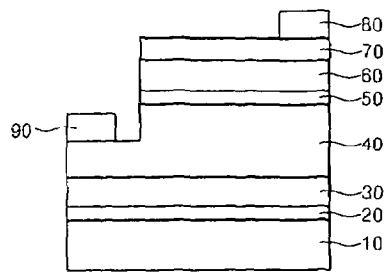
FIG. 1 is a sectional view showing a top-emitting light emitting diode (TELED) having a p-type multi ohmic contact electrode structure according to a first embodiment of the present invention.

Hereinafter, exemplary embodiments of the present invention will be described with reference to accompanying drawings. In the following description, elements having the same structure and functions may have the same reference numerals.

Figure 2:
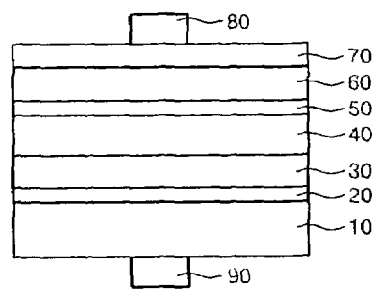
FIG. 2 is a sectional view showing a top-emitting light emitting diode (TELED) having a p-type multi ohmic contact electrode structure according to a second embodiment of the present invention.

FIG. 1 is a sectional view showing a top-emitting light emitting diode (TELED) having a p-type multi ohmic contact electrode structure according to a first embodiment of the present invention, and FIG. 2 is a sectional view showing a top-emitting light emitting diode (TELED) having a p-type multi ohmic contact electrode structure according to a second embodiment of the present invention.

In detail, FIG. 1 shows the III nitride-based TELED stacked/grown on a sapphire substrate 10, which is an insulating growth substrate, and FIG. 2 shows the III nitride-based TELED formed on a conductive substrate including silicon carbide (SiC), zinc oxide (ZnO), silicon (Si), gallium arsenic (GaAs), a metal, such as copper (Cu), nickel (Ni) or aluminum (Al), or an alloy formed through electroplating or a bonding transfer scheme.

Referring to FIGS. 1 and 2, the III nitride-based TELED includes a substrate 10 on which a low-temperature nucleation layer 20, a nitride-based buffer layer 30, an n-type nitride-based cladding layer 40, a nitride-based active layer 50, a p-type nitride-based cladding layer 60, and a p-type multi ohmic contact layer 70 are sequentially formed. Reference numbers 80 and 90 represent a p-type electrode pad and an n-type electrode pad, respectively. Here, layers from the substrate 10 to the p-type nitride-based cladding layer 60 may correspond to the light emitting structure and the structure stacked on the p-type nitride-based cladding layer 60 may correspond to the p-type electrode structure.

The substrate 10 includes one selected from the group consisting of sapphire ($Al_2O_3$), silicon carbide (SiC), zinc oxide (ZnO), silicon (Si), gallium arsenic (GaAs), a metal, such as copper (Cu), nickel (Ni), aluminum (Al), and an alloy formed through electroplating or a bonding transfer scheme.

The low-temperature nucleation layer 20 includes an amorphous gallium nitride (GaN) or aluminium nitride (AlN) formed at the low temperature of about 700° C. or below. The low-temperature nucleation layer 20 can be omitted. Each layer from the nitride-based buffer layer 30 to the p-type nitride-based cladding layer 60 basically includes one selected from compounds expressed as $Al_xIn_yGa_zN$ (x, y, and z are integers), which is a general formula of group-III nitride-based compound. Different dopants corresponding to the n-type and p-type are added to the n-type nitride-based cladding layer 40 and the p-type nitride-based cladding layer 60, respectively.

In addition, the nitride-based active layer 50 can be prepared in the form of a single layer, a multi-quantum well (MQW) structure, a multi quantum dot, a multi quantum wire, or a mixed structure of the multi quantum dot, wire and the well. For instance, if GaN-based compound is employed, the nitride-based buffer layer 30 includes GaN, the n-type nitride-based cladding layer 40 includes GaN and n-type dopants added to GaN, such as Si, Ge, Se, Te, etc., and the nitride-based active layer 50 includes an InGaN/GaN MQW structure or an AlGaN/GaN MQW structure. In addition, the p-type nitride-based cladding layer 60 includes GaN and p-type dopants added to GaN, such as Mg, Zn, Ca, Sr, Ba, etc.

An n-type ohmic contact layer (not shown) can be further interposed between the n-type nitride-based cladding layer 40 and the n-type electrode pad 90. The n-type ohmic contact layer may have various structures. For example, the n-type ohmic contact layer has a stack structure of titanium (Ti) and aluminum (Al).

The p-type multi ohmic contact layer 70 can be formed by depositing at least one TCON layer on the p-type nitride-based cladding layer 60. The TCON comprises at least one selected from a group of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), which is combined with both oxygen (O) and nitrogen (N).

Preferably, the TCON may further include other metal components as dopants so as to adjust the electrical characteristics. According to the present embodiment, chemical elements classified as metal in a periodic table can be used as the dopants for the TCON. Fluorine (F) or sulfur (S) can be used as the dopants. Preferably, the dopants is added to the TCON in a ratio of 0.001 weight percent to 20 weight percent.

Besides the TCON, the p-type multi ohmic contact layer 70 may further include metals, alloys/solid solution based on the metals, conducting oxide, transparent conducting oxide (TCO), and transparent conductive nitride (TCN), which are advantageous to form the ohmic contact electrode on the p-type nitride-based cladding layer 60, regardless of the deposition order thereof.

The metals include platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal. In addition, the alloys/solid solution may include alloys/solid solution based on the above metals.

The conducting oxide includes nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O).

The TCO includes indium oxide ($In_2O_3$), tin oxide ($SnO_2$), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide ($CuAlO_2$), silver oxide ($Ag_2O$), gallium oxide ($Ga_2O_3$), zinc tin oxide (ZnSnO), zinc indium tin oxide (ZITO), or other oxides combined with the above TCO.

The TCN includes titanium nitride (TiN), chrome nitride (CrN), tungsten nitride (WN), tantalum nitride (TaN), or niobium nitride (NbN).

Third materials can be added to the above-described oxide and nitride as dopants in order to improve electrical characteristics of the oxide and nitride. Preferably, the p-type multi ohmic contact layer 70 has a thickness of about 1 nm to about 1000 nm. In addition, the p-type multi ohmic contact layer 70 is deposited under the temperature of about 20° C. to about 1500° C. At this time, internal pressure of a depositor where the p-type multi ohmic contact layer 70 is deposited is in a range of about 10 torr to about 12 torr.

After the p-type multi-layered ohmic contact layer 70 has been formed, an annealing process is preferably performed. The annealing process is conducted in the vacuum or gas atmosphere for 10 seconds to 3 hours while setting the internal temperature of a reactor to about 100° C. to about 800° C. During the annealing process for the p-type multi ohmic contact layer 70, at least one of nitrogen, argon, helium, oxygen, hydrogen, and air is fed into the reactor.

The p-type electrode pad 80 has a stack structure of nickel (Ni)/gold (Au), silver (Ag)/gold (Au), titanium (Ti)/gold (Au), nickel (Ni)/gold (Au), palladium (Pd)/gold (Au), or chrome (Cr)/gold (Au).

Each layer of the III nitride-based light emitting diode can be formed through physical vapor deposition (PVD), such as e-beam or thermal evaporation, PLD (pulsed laser deposition) using a laser source, dual-type thermal evaporation or sputtering, or through chemical vapor deposition (CVD), such as electroplating or metalorganic chemical vapor deposition employing chemical reaction.

Figure 3:
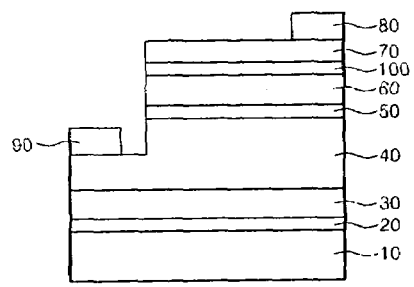
FIG. 3 is a sectional view showing a top-emitting light emitting diode (TELED) having a p-type multi ohmic contact electrode structure according to a third embodiment of the present invention.
Figure 4:
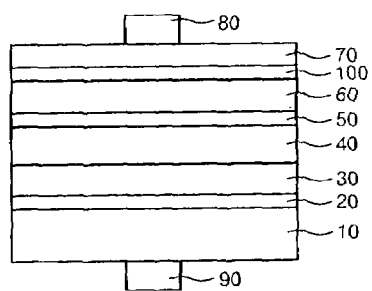
FIG. 4 is a sectional view showing a top-emitting light emitting diode (TELED) having a p-type multi ohmic contact electrode structure according to a fourth embodiment of the present invention.

FIG. 3 is a sectional view showing a top-emitting light emitting diode (TELED) having a p-type multi ohmic contact electrode structure according to a third embodiment of the present invention, and FIG. 4 is a sectional view showing a top-emitting light emitting diode (TELED) having a p-type multi ohmic contact electrode structure according to a fourth embodiment of the present invention.

In detail, FIG. 3 shows the III nitride-based TELED stacked/grown on a sapphire substrate 10, which is an insulating growth substrate, and FIG. 4 shows the III nitride-based TELED formed on a conductive substrate including silicon carbide (SiC), zinc oxide (ZnO), silicon (Si), gallium arsenic (GaAs), a metal, such as copper (Cu), nickel (Ni) or aluminum (Al), or an alloy formed through electroplating or a bonding transfer scheme.

Different from the first and second embodiments of the present invention, the third and fourth embodiments of the present invention provide a stack structure in which a tunnel junction layer 100 is formed on the p-type nitride-based cladding layer 60 before the p-type multi ohmic contact layer 70 is formed. The third embodiment corresponds to the first embodiment and the fourth embodiment corresponds to the second embodiment, except for the tunnel junction layer 100, so detailed description for the same elements will be omitted below in order to avoid redundancy. The tunnel junction layer 100 basically includes one selected from compounds expressed as $Al_aIn_bGa_cN_xP_yAs_z$ (a, b, c, x, y and z are integers) consisting of III-V elements. The tunnel junction layer 100 can be prepared in the form of a single layer having a thickness of about 50 nm or less. Preferably, the tunnel junction layer 100 is prepared in the form of a bi-layer, a tri-layer or a multi-layer. The tunnel junction layer 100 may have a super-lattice structure. For instance, 30 or less pairs of III-V group elements can be repeatedly stacked in the form of a thin stack structure, such as InGaN/GaN, AlGaN/GaN, AlInN/GaN, AlGaN/InGaN, AlInN/InGaN, AlN/GaN, or AlGaAs/InGaAs.

The tunnel junction layer 100 may include a single-crystal layer, a poly-crystal layer or an amorphous layer having II-group elements (Mg, Be, and Zn) or IV-group elements (Si and Ge) added thereto.

Referring to FIGS. 3 and 4, the III nitride-based TELED includes a substrate 10 on which a low-temperature nucleation layer 20, a nitride-based buffer layer 30, an n-type nitride-based cladding layer 40, a nitride-based active layer 50, a p-type nitride-based cladding layer 60, a p-type multi ohmic contact layer 70, and a tunnel junction layer 100 are sequentially formed. Reference numbers 80 and 90 represent a p-type electrode pad and an n-type electrode pad, respectively.

Here, layers from the substrate 10 to the p-type nitride-based cladding layer 60 may correspond to the light emitting structure and the structure stacked on the p-type nitride-based cladding layer 60 may correspond to the p-type electrode structure. Materials and fabrication methods for the low-temperature nucleation layer 20, the nitride-based buffer layer 30, the n-type nitride-based cladding layer 40, the nitride-based active layer 50, the p-type nitride-based cladding layer 60, and the p-type multi ohmic contact layer 70 are identical to those of the first and second embodiments.

FIGS. 5 to 8 are sectional views showing various stack structures of p-type multi ohmic contact layers formed on p-type nitride-based cladding layers shown in FIGS. 1 to 4.

The p-type multi ohmic contact layer 70 of the present invention includes at least one TCON layer combined with both oxygen ($O_2$) and nitrogen ($N_2$). Preferably, the p-type multi ohmic contact layer 70 is prepared in the form of a single layer, a dual layer or a multi-layer.

Figure 5:
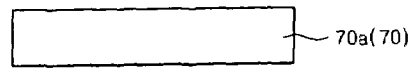
FIGS. 5 to 8 are sectional views showing various stack structures of p-type multi ohmic contact layers formed on p-type nitride-based cladding layers shown in FIGS. 1 to 4.
Figure 6:
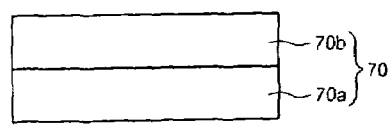
Figure 7:
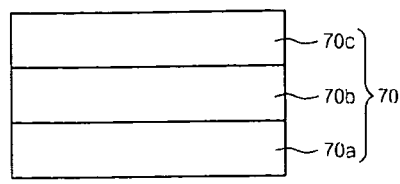
Figure 8:
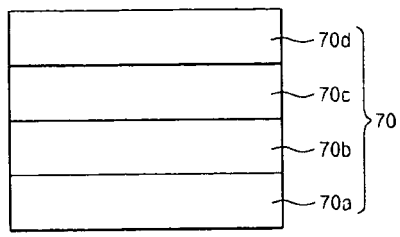

For instance, as shown in FIG. 5, the p-type multi ohmic contact layer 70 can be prepared as a single layer 70a including TCON. In addition, as shown in FIGS. 6 to 8, the p-type multi ohmic contact layer 70 can be prepared as multi-layers 70a, 70b, 70c and 70d including metals, alloys, solid solution, conducting oxide, TCO, and TCON regardless of the deposition order thereof.

FIGS. 9 to 12 are sectional views showing various stack structures of p-type multi ohmic contact layers formed on p-type nitride-based cladding layers shown in FIGS. 1 to 4 after introducing nanometer scale particles onto the p-type nitride-based cladding layers.

Before the p-type multi ohmic contact layer 70 of the present invention is formed on the p-type nitride-based cladding layer 60, nano-scaled particles are formed on the p-type nitride-based cladding layer 60. Here, the nano-scaled particles include metals, alloys, solid solution, conducting oxide, TCO, TCN, or TCON capable of controlling the height and width of the Schottky barrier that adjusts the charge transport of carriers at the interfacial surface between the p-type nitride-based cladding layer 60 and the p-type multi ohmic contact layer 70. As described above, the p-type multi ohmic contact layer 70 includes at least one TCON layer combined with both oxygen ($O_2$) and nitrogen ($N_2$). Preferably, the p-type multi ohmic contact layer 70 is prepared in the form of a single layer, a dual layer or a multi-layer.

Figure 9:
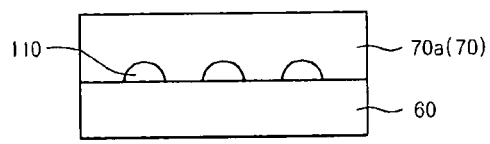
FIGS. 9 to 12 are sectional views showing various stack structures of p-type multi ohmic contact layers formed on p-type nitride-based cladding layers shown in FIGS. 1 to 4 after introducing nanometer scale particles onto the p-type nitride-based cladding layers.
Figure 10:
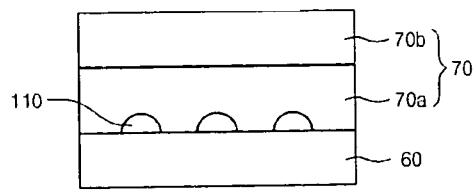
Figure 11:
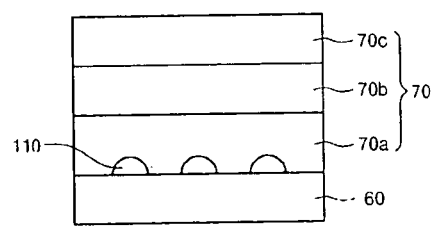
Figure 12:
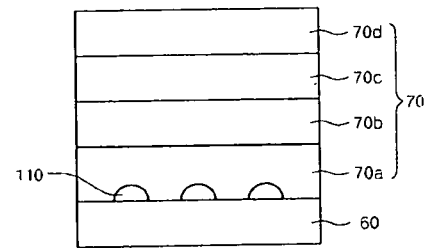

For instance, as shown in FIG. 9, the p-type multi ohmic contact layer 70 can be prepared as a single layer 70a including TCON. In addition, as shown in FIGS. 10 to 12, the p-type multi ohmic contact layer 70 can be prepared as multi-layers 70a, 70b, 70c and 70d including metals, alloys, solid solution, conducting oxide, TCO, and TCON regardless of the deposition order thereof.

In detail, the p-type multi ohmic contact layer 70 can be prepared by stacking nickel (Ni)/indium tin oxynitride (ITON) or zinc oxynitride (ZnON); ruthenium (Ru)/indium tin oxynitride (ITON) or zinc oxynitride (ZnON); iridium (Ir)/indium tin oxynitride (ITON) or zinc oxynitride (ZnON); nickel oxide (Ni—O)/indium tin oxynitride (ITON) or zinc oxynitride (ZnON); ruthenium oxide (Ru—O)/indium tin oxynitride (ITON) or zinc oxynitride (ZnON); iridium oxide (Ir—O)/indium tin oxynitride (ITON) or zinc oxynitride (ZnON); nickel (Ni)/silver (Ag) or gold (Au)/indium tin oxynitride (ITON) or zinc oxynitride (ZnON); ruthenium (Ru)/silver (Ag) or gold (Au)/indium tin oxynitride (ITON) or zinc oxynitride (ZnON); iridium (Ir)/silver (Ag) or gold (Au)/indium tin oxynitride (ITON) or zinc oxynitride (ZnON); nickel oxide (Ni—O)/silver (Ag) or gold (Au)/indium tin oxynitride (ITON) or zinc oxynitride (ZnON); ruthenium oxide (Ru—O)/silver (Ag) or gold (Au)/indium tin oxynitride (ITON) or zinc oxynitride (ZnON); iridium oxide (Ir—O)/silver (Ag) or gold (Au)/indium tin oxynitride (ITON) or zinc oxynitride (ZnON); indium tin oxide (ITO) or zinc oxide (ZnO)/indium tin oxynitride (ITON) or zinc oxynitride (ZnON); or indium tin oxynitride (ITON) or zinc oxynitride (ZnON)/indium tin oxide (ITO) or zinc oxide (ZnO).

Figure 13:
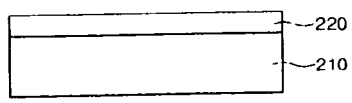
FIG. 13 is a sectional view showing a structure of a highly transparent n-type multi Schottky contact layer formed on an n-type nitride-based cladding layer according to a fifth embodiment of the present invention.
Figure 14:
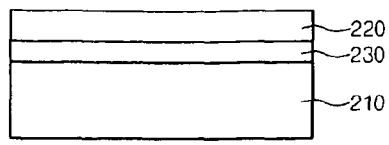
FIG. 14 is a sectional view showing a structure of a highly transparent n-type multi Schottky contact layer formed on an n-type nitride-based cladding layer according to a sixth embodiment of the present invention.

FIG. 13 is a sectional view showing a structure of a highly transparent n-type multi Schottky contact layer formed on an n-type nitride-based cladding layer according to a fifth embodiment of the present invention, and FIG. 14 is a sectional view showing a structure of a highly transparent n-type multi Schottky contact layer formed on an n-type nitride-based cladding layer according to a sixth embodiment of the present invention.

In detail, FIG. 13 shows the highly transparent n-type multi Schottky contact layer 220 directly formed on the n-type nitride-based cladding layer 210, and FIG. 14 shows the highly transparent n-type multi Schottky contact layer 220 formed on the n-type nitride-based cladding layer 210 while interposing a tunnel junction layer 230 therebetween.

Referring to FIGS. 13 and 14, the n-type nitride-based cladding layer 210 basically includes one selected from compounds expressed as $Al_xIn_yGa_zN$ (x, y, and z are integers), which is a general formula of group-III nitride-based compound. Dopants, such as Si, Ge, Se, and Te, which are group-IV elements, are solely or simultaneously added to the n-type nitride-based cladding layer 210.

The highly transparent n-type multi Schottky contact layer 220 can be formed by depositing at least one TCON layer on the n-type nitride-based cladding layer 210.

The TCON mainly comprises at least one selected from a group of indium (In), tin (Sn), zinc (Zn), cadmium (Cd), gallium (Ga), aluminum (Al), magnesium (Mg), titanium (Ti), molybdenum (Mo), tantalum (Ta), vanadium (V), chrome (Cr), niobium (Nb), zirconium (Zr), silver (Ag), nickel (Ni), copper (Cu), cobalt (Co), gold (Au), platinum (Pt), rhenium (Re), iridium (Ir), tungsten (W), ruthenium (Ru), and palladium (Pd), which is combined with both oxygen (O) and nitrogen (N).

Preferably, the TCON may further include other metal components as dopants so as to adjust the electrical characteristics. According to the present embodiment, chemical elements classified as metal in a periodic table can be used as the dopants for the TCON. Fluorine (F) or sulfur (S) can be used as the dopants. Preferably, the dopants is added to the TCON in a ratio of 0.001 weight percent to 20 weight percent.

In addition to the TCON, the highly transparent n-type multi Schottky contact layer 220 may further include metals, alloys/solid solution based on the metals, conducting oxide, transparent conducting oxide (TCO), and transparent conductive nitride (TCN), which are advantageous to form the Schottky contact interfacial surface on the n-type nitride-based cladding layer 210, regardless of the deposition order thereof.

The metals include platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), or rare earth metal. In addition, the alloys/solid solution may include alloys/solid solution based on the above metals.

The conducting oxide includes nickel oxide (Ni—O), rhodium oxide (Rh—O), ruthenium oxide (Ru—O), iridium oxide (Ir—O), copper oxide (Cu—O), cobalt oxide (Co—O), tungsten oxide (W—O), or titanium oxide (Ti—O).

The TCO includes indium oxide ($In_2O_3$), tin oxide ($SnO_2$), indium tin oxide (ITO), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide ($CuAlO_2$), silver oxide ($Ag_2O$), gallium oxide ($Ga_2O_3$), zinc tin oxide (ZnSnO), zinc indium tin oxide (ZITO), or other oxides combined with the above TCO.

The TCN includes titanium nitride (TiN), chrome nitride (CrN), tungsten nitride (WN), tantalum nitride (TaN), or niobium nitride (NbN).

Third materials can be added to the above-described oxide and nitride as dopants in order to improve electrical characteristics of the oxide and nitride.

Preferably, the highly transparent n-type multi Schottky contact layer 220 has a thickness of about 1 nm to about 1000 nm. In addition, the highly transparent n-type multi Schottky contact layer 220 is deposited under the temperature of about 20° C. to about 1500° C. At this time, internal pressure of a depositor where the highly transparent n-type multi Schottky contact layer 220 is deposited is in a range of about 10 torr to about 12 torr.

After the highly transparent n-type multi Schottky contact layer 220 has been formed, an annealing process is preferably performed. The annealing process is conducted in the vacuum or gas atmosphere for 10 seconds to 3 hours while setting the internal temperature of a reactor to about 100° C. to about 800° C. During the annealing process, at least one of nitrogen, argon, helium, oxygen, hydrogen, and air is fed into the reactor.

In the embodiment shown in FIG. 14, the tunnel junction layer 230 basically includes one selected from compounds expressed as AlaInbGacNxPyAsz (a, b, c, x, y and z are integers) consisting of III-V elements. The tunnel junction layer 230 can be prepared in the form of a single layer having a thickness of about 50 nm or less.

Preferably, the tunnel junction layer 230 is prepared in the form of a bi-layer, a tri-layer or a multi-layer.

The tunnel junction layer 230 may have a super-lattice structure. For instance, 30 or less pairs of III-V group elements can be repeatedly stacked in the form of a thin stack structure, such as InGaN/GaN, AlGaN/GaN, AlInN/GaN, AlGaN/InGaN, AlInN/InGaN, AlN/GaN, or AlGaAs/InGaAs. At this time, each layer of the tunnel junction layer 230 is can be prepared in the form of a single-crystal layer, a poly-crystal layer or an amorphous layer having II-group elements (Mg, Be, and Zn) or IV-group elements (Si and Ge) added thereto.

In addition, each layer of the tunnel junction layer 230 can be formed through physical vapor deposition (PVD), such as e-beam or thermal evaporation, PLD (pulsed laser deposition) using a laser source, dual-type thermal evaporation or sputtering, or through chemical vapor deposition (CVD), such as electroplating or metalorganic chemical vapor deposition employing chemical reaction.

Figure 15:
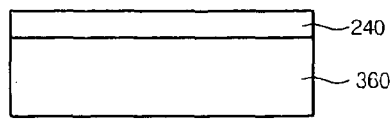
FIG. 15 is a sectional view showing a structure of a highly transparent n-type multi ohmic contact layer formed on an n-type nitride-based cladding layer according to a seventh embodiment of the present invention.
Figure 16:
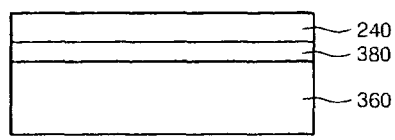
FIG. 16 is a sectional view showing a structure of a highly transparent n-type multi ohmic contact layer formed on an n-type nitride-based cladding layer according to an eighth embodiment of the present invention.
Figure 17:
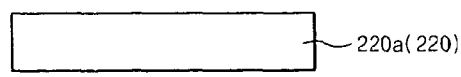
FIGS. 17 to 20 are sectional views showing various stack structures of highly transparent n-type multi Schottky contact layers and ohmic contact layers formed on n-type nitride-based cladding layers shown in FIGS. 13 to 16.
Figure 18:
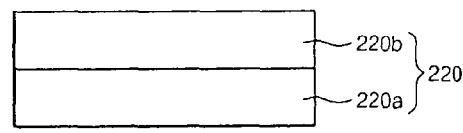
Figure 19:
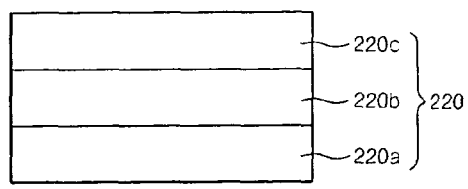
Figure 20:
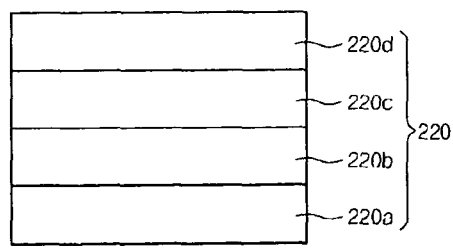
Figure 21:
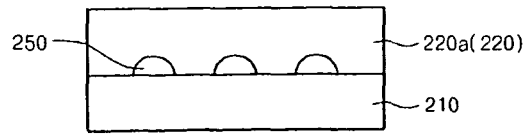
FIGS. 21 to 24 are sectional views showing various stack structures of highly transparent n-type multi Schottky contact layers and ohmic contact layers formed on n-type nitride-based cladding layers shown in FIGS. 13 to 16 after introducing nanometer scale particles onto the n-type nitride-based cladding layers.
Figure 22:
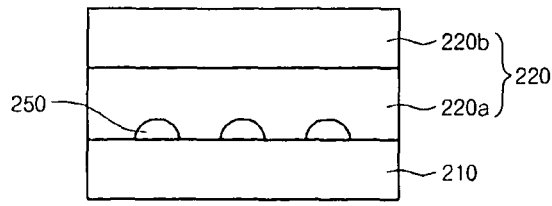
Figure 23:
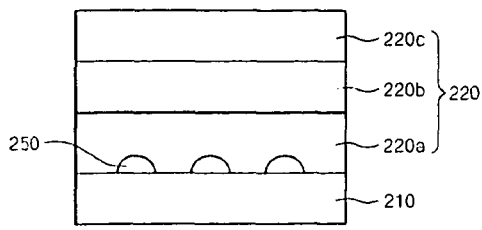
Figure 24:
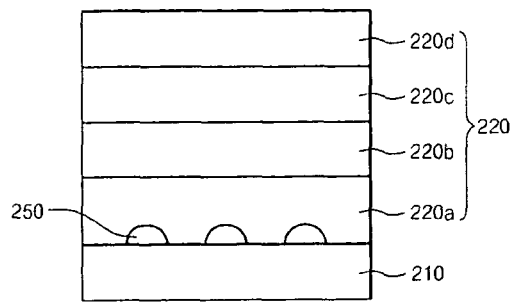

FIG. 15 is a sectional view showing a structure of a highly transparent n-type multi ohmic contact layer formed on an n-type nitride-based cladding layer according to a seventh embodiment of the present invention, and FIG. 16 is a sectional view showing a structure of a highly transparent n-type multi ohmic contact layer formed on an n-type nitride-based cladding layer according to an eighth embodiment of the present invention.

In detail, FIG. 15 shows the highly transparent n-type multi ohmic contact layer 240 directly formed on the n-type nitride-based cladding layer 360, and FIG. 16 shows the highly transparent n-type multi ohmic contact layer 240 formed on the n-type nitride-based cladding layer 360 while interposing a tunnel junction layer 380 therebetween.

The seventh embodiment corresponds to the fifth embodiment and the eighth embodiment corresponds to the sixth embodiment, so detailed description for the same elements will be omitted below in order to avoid redundancy.

Referring to FIGS. 15 and 16, the n-type nitride-based cladding layer 360 basically includes one selected from compounds expressed as AlxInyGazN (x, y, and z are integers), which is a general formula of group-III nitride-based compound. Dopants, such as Si, Ge, Se, and Te, which are group-IV elements, can be solely or simultaneously added to the n-type nitride-based cladding layer 360.

The highly transparent n-type multi ohmic contact layer 240 can be formed by depositing at least one TCON layer on the n-type nitride-based cladding layer 360.

Components of the TCON and dopants added to the TCON to adjust the electrical characteristics are identical to those of the fifth and sixth embodiments. Meanwhile, the highly transparent n-type multi ohmic contact layer 240 may include not only the TCON, but also metals, alloys/solid solution based on the metals, conducting oxide, transparent conducting oxide (TCO), and transparent conductive nitride (TCN), which are advantageous to form the ohmic contact electrode on the n-type nitride-based cladding layer 360, regardless of the deposition order thereof. Components of the metals, alloys/solid solution based on the metals, conducting oxide, transparent conducting oxide (TCO), and transparent conductive nitride (TCN) are identical to those of the fifth and sixth embodiments. In addition, third materials can be added to the above-described oxide and nitride as dopants in order to improve electrical characteristics of the oxide and nitride.

Preferably, the highly transparent n-type multi ohmic contact layer 240 has a thickness of about 1 nm to about 1000 nm. In addition, the highly transparent n-type multi ohmic contact layer 240 is deposited under the temperature of about 20° C. to about 1500° C. At this time, internal pressure of a depositor where the highly transparent n-type multi ohmic contact layer 240 is deposited is in a range of about 10 torr to about 12 torr.

After the highly transparent n-type multi ohmic contact layer 240 has been formed, an annealing process is preferably performed. The annealing process is conducted in the vacuum or gas atmosphere for 10 seconds to 3 hours while setting the internal temperature of a reactor to about 100° C. to about 800° C. During the annealing process, at least one of nitrogen, argon, helium, oxygen, hydrogen, and air is fed into the reactor.

In the embodiment shown in FIG. 16, the tunnel junction layer 380 basically includes one selected from compounds expressed as AlaInbGacNxPyAsz (a, b, c, x, y and z are integers) consisting of III-V elements. The tunnel junction layer 390 can be prepared in the form of a single layer or a multi layer. In addition, the tunnel junction layer 380 may have a super-lattice structure.

Each layer of the tunnel junction layer 380 can be formed through physical vapor deposition (PVD), such as e-beam or thermal evaporation, PLD (pulsed laser deposition) using a laser source, dual-type thermal evaporation or sputtering, or through chemical vapor deposition (CVD), such as electroplating or metalorganic chemical vapor deposition employing chemical reaction.

FIGS. 17 to 20 are sectional views showing various stack structures of highly transparent n-type multi Schottky contact layers and ohmic contact layers formed on n-type nitride-based cladding layers shown in FIGS. 13 to 16.

Referring to FIGS. 17 to 20, the highly transparent n-type multi Schottky contact layer 220 formed on the n-type nitride-based cladding layer 210 can be prepared in the form of a single layer 220a, dual layers 220a and 220b, or multi-layers 220a, 220b, 220c and 220d including at least one TCON layer. The function and structure of the highly transparent n-type multi Schottky contact layer 220 shown in FIGS. 17 to 20 are identically applied to the highly transparent n-type multi ohmic contact layer 240.

FIGS. 21 to 24 are sectional views showing various stack structures of highly transparent n-type multi Schottky contact layers and ohmic contact layers formed on n-type nitride-based cladding layers shown in FIGS. 13 to 16 after introducing nanometer scale particles onto the n-type nitride-based cladding layers.

Referring to FIGS. 21 to 24, before the highly transparent n-type multi Schottky contact layer 220 is formed on the n-type nitride-based cladding layer 210, nano-scaled particles 250 capable of controlling the height and width of the Schottky barrier, which is an interfacial characteristic that exerts great influence upon the charge transport of carriers, are formed on the n-type nitride-based cladding layer 210. The nano-scaled particles 250 include metals, alloys, solid solution, conducting oxide, TCO, TCN, or TCON capable of controlling the height and width of the Schottky barrier that adjusts the charge transport of carriers at the interfacial surface between the n-type nitride-based cladding layer 210 and the highly transparent n-type multi Schottky contact layer 220. Then, both oxygen ($O_2$) and nitrogen ($N_2$) are combined with the nano-scaled particles 250, thereby forming a single layer 220a, dual layers 220a and 220b, or multi-layers 220a, 220b, 220c and 220d including at least one TCON layer. The function and structure of the highly transparent n-type multi Schottky contact layer 220 shown in FIGS. 21 to 24 are identically applied to the highly transparent n-type multi ohmic contact layer 240.

Figure 25:
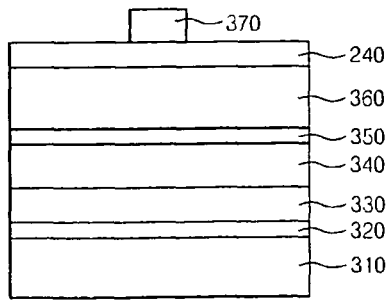
FIG. 25 is a sectional view showing an LED including a highly transparent n-type multi ohmic contact layer formed on an n-type nitride-based cladding layer according to a ninth embodiment of the present invention.
Figure 26:
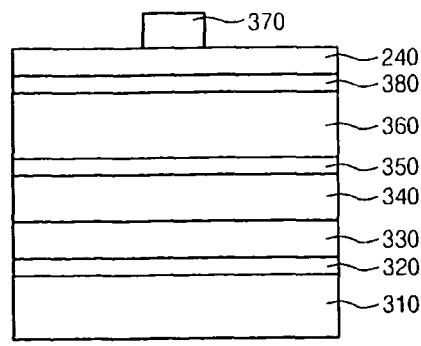
FIG. 26 is a sectional view showing a III nitride-based LED including a highly transparent n-type multi ohmic contact layer formed on an n-type nitride-based cladding layer according to a tenth embodiment of the present invention.

FIG. 25 is a sectional view showing an LED including a highly transparent n-type multi ohmic contact layer formed on an n-type nitride-based cladding layer according to a ninth embodiment of the present invention, and FIG. 26 is a sectional view showing a III nitride-based LED including a highly transparent n-type multi ohmic contact layer formed on an n-type nitride-based cladding layer according to a tenth embodiment of the present invention.

In detail, FIGS. 25 and 26 show the structure of a vertical LED formed on a conductive substrate including silicon carbide (SiC), zinc oxide (ZnO), silicon (Si), gallium arsenic (GaAs), a metal, such as copper (Cu), nickel (Ni) or aluminum (Al), or an alloy formed through electroplating or a bonding transfer scheme.

Referring to FIGS. 25 and 26, the LED includes a conductive substrate 310 on which a bonding material layer 320, a highly reflective p-type ohmic contact layer 330, a p-type nitride-based cladding layer 340, a nitride-based active layer 350, an n-type nitride-based cladding layer 360, and a highly transparent n-type multi ohmic contact layer 240 are sequentially formed. Reference numbers 380 and 370 represent a tunnel junction layer used to improve the characteristic of the highly transparent n-type multi ohmic contact layer 240 and an n-type electrode pad, respectively.

The conductive substrate 310 includes one selected from the group consisting of silicon (Si), silicon carbide (SiC), zinc oxide (ZnO), gallium arsenic (GaAs), a metal, such as copper (Cu), nickel (Ni), aluminum (Al), and an alloy formed through electroplating or a bonding transfer scheme.

Each layer from the n-type nitride-based cladding layer 360 to the p-type nitride-based cladding layer 340 basically includes one selected from compounds expressed as $Al_xIn_yGa_zN$ (x, y, and z are integers), which is a general formula of group-III nitride-based compound. Dopants are added to the n-type nitride-based cladding layer 360 and the p-type nitride-based cladding layer 340. In addition, the nitride-based active layer 350 can be prepared in the form of a single layer, a multi-quantum well (MQW) structure, a multi quantum dot, a multi quantum wire, or a mixed structure of the multi quantum dot, wire and the MQW.

For instance, the n-type nitride-based cladding layer 360 can be formed by adding n-type dopants, such as Si, Ge, Se, Te, etc., to GaN. In addition, the nitride-based active layer 350 can be prepared in the form of an InGaN/GaN MQW structure or an AlGaN/GaN MQW structure and the p-type nitride-based cladding layer 340 can be formed by adding p-type dopants, such as Mg, Zn, Ca, Sr, Ba, etc., to GaN.

The highly transparent n-type multi ohmic contact layer 240 can be formed by depositing at least one TCON layer on the n-type nitride-based cladding layer 360. The TCON mainly consists of metals and both oxygen (O) and nitrogen (N) are essentially combined with the TCON. Preferably, the TCON may further include dopants so as to adjust the electrical characteristics.

In addition to the TCON, the highly transparent n-type multi ohmic contact layer 240 may further include metals, alloys/solid solution based on the metals, conducting oxide, transparent conducting oxide (TCO), and transparent conductive nitride (TCN), which are advantageous to form the ohmic contact electrode on the n-type nitride-based cladding layer 360, regardless of the deposition order thereof.

Metals which are main components of TCON, composition and percentage of the dopant, and the metal/alloy/solution/conducting oxide/TCO/TCN structure are identical to those of the seventh embodiment.

Preferably, the highly transparent n-type multi ohmic contact layer 240 has a thickness of about 1 nm to about 1000 nm. In addition, the highly transparent n-type multi ohmic contact layer 240 is deposited under the temperature of about 20° C. to about 1500° C. At this time, internal pressure of a depositor where the highly transparent n-type multi ohmic contact layer 240 is deposited is in a range of about 10 torr to about 12 torr.

After the highly transparent n-type multi ohmic contact layer 240 has been formed, an annealing process is preferably performed. The annealing process is conducted in the vacuum or gas atmosphere for 10 seconds to 3 hours while setting the internal temperature of a reactor to about 100° C. to about 800° C. During the annealing process, at least one of nitrogen, argon, helium, oxygen, hydrogen, and air is fed into the reactor.

The n-type electrode pad 370 has a stacked structure, in which nickel (Ni)/gold (Au), silver (Ag)/gold, titanium (Ti)/gold, palladium (Pd)/gold, or chrome (Cr)/gold is sequentially deposited.

Each layer of the LED can be formed through physical vapor deposition (PVD), such as e-beam or thermal evaporation, PLD (pulsed laser deposition) using a laser source, dual-type thermal evaporation or sputtering, or through chemical vapor deposition (CVD), such as electroplating or metalorganic chemical vapor deposition employing chemical reaction.

Industrial Applicability

As described above, the optical device according to the present invention can be employed in various devices, such as a light receiving device, a light emitting device, a light emitting diode, an organic light emitting diode (OLED), or a solar cell.

The invention claimed is:
1. An optical device comprising:
an optical member;
a contact layer including at least one transparent conducting oxynitride (TCON) layer stacked on at least one of top and bottom surfaces of the optical member, wherein the TCON comprises at least one selected from a group consisting of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), which is combined with both oxygen (0) and nitrogen (N); and nanometer scale particles disposed on a surface of an n-type nitride cladding layer of the optical member and under the contact layer.

2. The optical device of claim 1, wherein the optical member further comprises a p-type nitride cladding layer, and an active layer interposed between the n-type nitride cladding layer and the p-type nitride cladding layer.

3. The optical device of claim 2, wherein the contact layer includes at least one of an n-type contact layer formed on the n-type nitride cladding layer and a p-type contact layer formed on the p-type nitride cladding layer.

4. The optical device of claim 1, wherein the TCON further comprises dopant to adjust electric characteristics and the dopant includes at least one selected from the group consisting of a metal, fluorine (F) and sulfur (S).

5. The optical device of claim 4, wherein the dopant is added to the TCON in a ratio of about 0.001 weight percent to about 20 weight percent.

6. The optical device of claim 1, wherein the metal includes at least one selected from a group consisting of platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), and rare earth metal, the conducting oxide includes at least one selected from a group consisting of nickel oxide (Ni——O), rhodium oxide (Rh——O), ruthenium oxide (Ru——O), iridium oxide (Ir——O), copper oxide (Cu——O), cobalt oxide (Co——O), tungsten oxide (W——0), or titanium oxide (Ti——O), the TCO includes at least one selected from a group consisting of indium oxide ($In_2O_3$), tin oxide ($SnO_2$), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide ($CuAlO_2$), silver oxide ($Ag_2O$), gallium oxide ($Ga_2O_3$), zinc tin oxide (ZnSnO), and zinc indium tin oxide (ZITO), and the TCN includes at least one selected from a group consisting of titanium nitride (TiN), chrome nitride (CrN), tungsten nitride (WN), tantalum nitride (TaN), or niobium nitride (NbN).

7. The optical device of claim 6, wherein the nano-scaled particles include at least one selected from the group consisting of metals, alloys/solid solution based on the metals, conducting oxide, transparent conducting oxide (TCO), and transparent conductive nitride (TCN).

8. The optical device of claim 1, further comprising a tunnel junction layer, which is interposed between the optical member and the contact layer and includes one selected from compounds expressed as $Al_aIn_bGa_cN_xP_yAs_z$ (a, b, c, x, y and z are integers) consisting of III-V elements.

9. The optical device of claim 1, wherein the optical member is applied to any one of a light receiving device, a light emitting device, a light emitting diode, an organic light emitting diode (OLED), and a solar cell.

10. A method of fabricating an optical device, the method comprising:
forming an optical member;
forming a contact layer by stacking at least one transparent conducting oxynitride (TCON) layer on at least one of top and bottom surfaces of the optical member, wherein the TCON comprises at least one selected from a group consisting of indium (In), tin (Sn), zinc (Zn), cadmium (Cd), gallium (Ga), aluminum (Al), magnesium (Mg), titanium (Ti), molybdenum (Mo), nickel (Ni), copper (Cu), silver (Ag), gold (Au), platinum (Pt), rhodium (Rh), iridium (Ir), ruthenium (Ru), and palladium (Pd), which is combined with both oxygen (O) and nitrogen; and
disposing nanometer scale particles onto a surface of an n-type nitride cladding layer of the optical member and under the contact layer, wherein the nano-scaled particles include at least one selected from the group consisting of metals, alloys/solid solution based on the metals, conducting oxide, transparent conducting oxide (TCO), and transparent conductive nitride (TCN).

11. The method of claim 10, wherein the optical member comprises an n-type nitride cladding layer, a p-type nitride cladding layer, and an active layer interposed between the n-type nitride cladding layer and the p-type nitride cladding layer.

12. The method of claim 11, wherein the contact layer includes at least one of an n-type contact layer formed on the n-type nitride cladding layer and a p-type contact layer formed on the p-type nitride cladding layer.

13. The method of claim 10, wherein the TCON further comprises dopant to adjust electric characteristics and the dopant includes at least one selected from the group consisting of a metal, fluorine (F) and sulfur (S).

14. The method of claim 13, wherein the dopant is added to the TCON in a ratio of about 0.001 weight percent to 20 weight percent.

15. The method of claim 10, wherein the contact layer further comprises at least one selected from a group consisting of metals, alloys/solid solution based on the metals, conducting oxide, transparent conducting oxide (TCO), and transparent conductive nitride (TCN), which are combined with the TCON layer.

16. The method of claim 15, wherein the metal includes at least one selected from a group consisting of platinum (Pt), palladium (Pd), nickel (Ni), gold (Au), rhodium (Rh), ruthenium (Ru), iridium (Ir), silver (Ag), zinc (Zn), magnesium (Mg), beryllium (Be), copper (Cu), cobalt (Co), tin (Sn), and rare earth metal, the conducting oxide includes at least one selected from a group consisting of nickel oxide (Ni——O), rhodium oxide (Rh——O), ruthenium oxide (Ru——O), iridium oxide (Ir——O), copper oxide (Cu——O), cobalt oxide (Co——O), tungsten oxide (W——0), or titanium oxide (Ti——O), the TCO includes at least one selected from a group consisting of indium oxide ($In_2O_3$), tin oxide ($SnO_2$), zinc oxide (ZnO), magnesium oxide (MgO), cadmium oxide (CdO), magnesium zinc oxide (MgZnO), indium zinc oxide (InZnO), indium tin oxide (InSnO), copper aluminum oxide ($CuAlO_2$), silver oxide ($Ag_2O$), gallium oxide ($Ga_2O_3$), zinc tin oxide (ZnSnO), and zinc indium tin oxide (ZITO), and the TCN includes at least one selected from a group consisting of titanium nitride (TiN), chrome nitride (CrN), tungsten nitride (WN), tantalum nitride (TaN), or niobium nitride (NbN).

17. The method of claim 16, wherein nano-scaled particles are introduced onto the nitride cladding layer so as to combine with the contact layer, and the nano-scaled particles include at least one selected from the group consisting of metals, alloys/solid solution based on the metals, conducting oxide, transparent conducting oxide (TCO), and transparent conductive nitride (TCN).

18. The method of claim 10, further comprising performing a heat process after forming a contact layer.

19. The method of claim 18, wherein the heat process is conducted for about 10 seconds to about 3 hours at a temperature from about 100° C. to about 800° C. under a gas atmosphere including at least one selected from a group consisting of nitrogen ($N_2$), oxygen ($O_2$), hydrogen ($H_2$), argon (Ar), helium (He) and air.

20. The optical device of claim 1, wherein the contact layer further comprises at least one selected from a group consisting of metals, alloys/solid solution based on the metals, conducting oxide, transparent conducting oxide (TCO), and transparent conductive nitride (TCN), which are combined with the TCON layer.

\* \* \* \* \*